(12) United States Patent
Ramanathan et al.

(10) Patent No.: US 7,211,890 B2
(45) Date of Patent: May 1, 2007

(54) INTEGRATING THERMOELECTRIC ELEMENTS INTO WAFER FOR HEAT EXTRACTION

(75) Inventors: Shriram Ramanathan, Hillsboro, OR (US); Gregory M. Chrysler, Chandler, AZ (US); David Chau, Chandler, AZ (US); Ryan Lei, Hillboro, OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 10/676,585

(22) Filed: Sep. 30, 2003

(65) Prior Publication Data
US 2005/0067692 A1 Mar. 31, 2005

(51) Int. Cl.
*H01L 23/34* (2006.01)

(52) U.S. Cl. .................. 257/713; 257/717; 257/720

(58) Field of Classification Search .............. 257/712, 257/713, 717, 718, 719, 720
See application file for complete search history.

(56) References Cited

U.S. PATENT DOCUMENTS

| 6,222,113 B1 * | 4/2001 | Ghoshal ................ 136/201 |
|---|---|---|
| 6,388,185 B1 * | 5/2002 | Fleurial et al. ............ 136/205 |
| 6,424,533 B1 * | 7/2002 | Chu et al. .................. 361/719 |
| 6,614,109 B2 * | 9/2003 | Cordes et al. ............. 257/712 |
| 2002/0063330 A1 * | 5/2002 | Macris ...................... 257/712 |
| 2005/0045702 A1 * | 3/2005 | Freeman et al. ........... 228/254 |

* cited by examiner

*Primary Examiner*—Tuan H. Nguyen
(74) *Attorney, Agent, or Firm*—Blakely, Sokoloff, Taylor & Zafman LLP

(57) ABSTRACT

An embodiment of the present invention is a technique to provide heat extraction for semiconductor devices. At least a thermoelectric film is fabricated onto a bare wafer. The backside of the bare wafer is bonded to an active wafer having at least a device. The bonded bare and active wafers are annealed.

18 Claims, 3 Drawing Sheets

INTEGRATING THERMOELECTRIC ELEMENTS INTO WAFER FOR HEAT EXTRACTION

BACKGROUND

1. Field of the Invention

Embodiments of the invention relate to the field of semiconductor, and more specifically, to heat extraction.

2. Description of Related Art

Heat extraction from, or cooling, microelectronic devices or processors is challenging due to their high average power dissipation and localized high heat flux areas, or hot spots. As operating frequency increases for high performance processors, heat extraction is becoming a fundamental design problem.

Existing techniques to solve the above problem are inadequate. Traditional techniques include the use of a heat sink to dissipate heat generated from the device or processor. Typically, the heat sink is attached to the silicon die via a heat spreader. This method has a number of disadvantages. First, the heat extraction is not efficient because of inefficient thermal interface between the heat sink and the silicon die. Second, there is no flexibility in localized control of cooling because the heat sink is attached to the entire silicon die. Third, the manufacturing process is inefficient because the heat sink is placed onto the silicon die after the die has been created.

BRIEF DESCRIPTION OF THE DRAWINGS

The invention may best be understood by referring to the following description and accompanying drawings that are used to illustrate embodiments of the invention. In the drawings.

DESCRIPTION

An embodiment of the present invention is a technique to provide heat extraction for semiconductor devices. At least a thermoelectric film or device is fabricated onto a bare wafer. The backside of the bare wafer is bonded to an active wafer having at least a device. The bonded bare and active wafers are annealed.

In the following description, numerous specific details are set forth. However, it is understood that embodiments of the invention may be practiced without these specific details. In other instances, well-known circuits, structures, and techniques have not been shown in order not to obscure the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, a method of manufacturing or fabrication, etc.

One embodiment of the present invention provides a technique to extract heat from semiconductor devices such as microprocessors. When a microprocessor operates at high frequencies, heat fluxes may be generated locally or in large regions. Heat fluxes on large areas may be as high as greater than 100 W/cm$^2$. For local areas, the values may be even much higher (e.g., >600 W/cm$^2$). One embodiment of the present invention incorporates thermoelectric converters (TEC's), elements, films, or modules into a wafer to be bonded with a wafer that contains the microelectronic devices.

Figure 1:
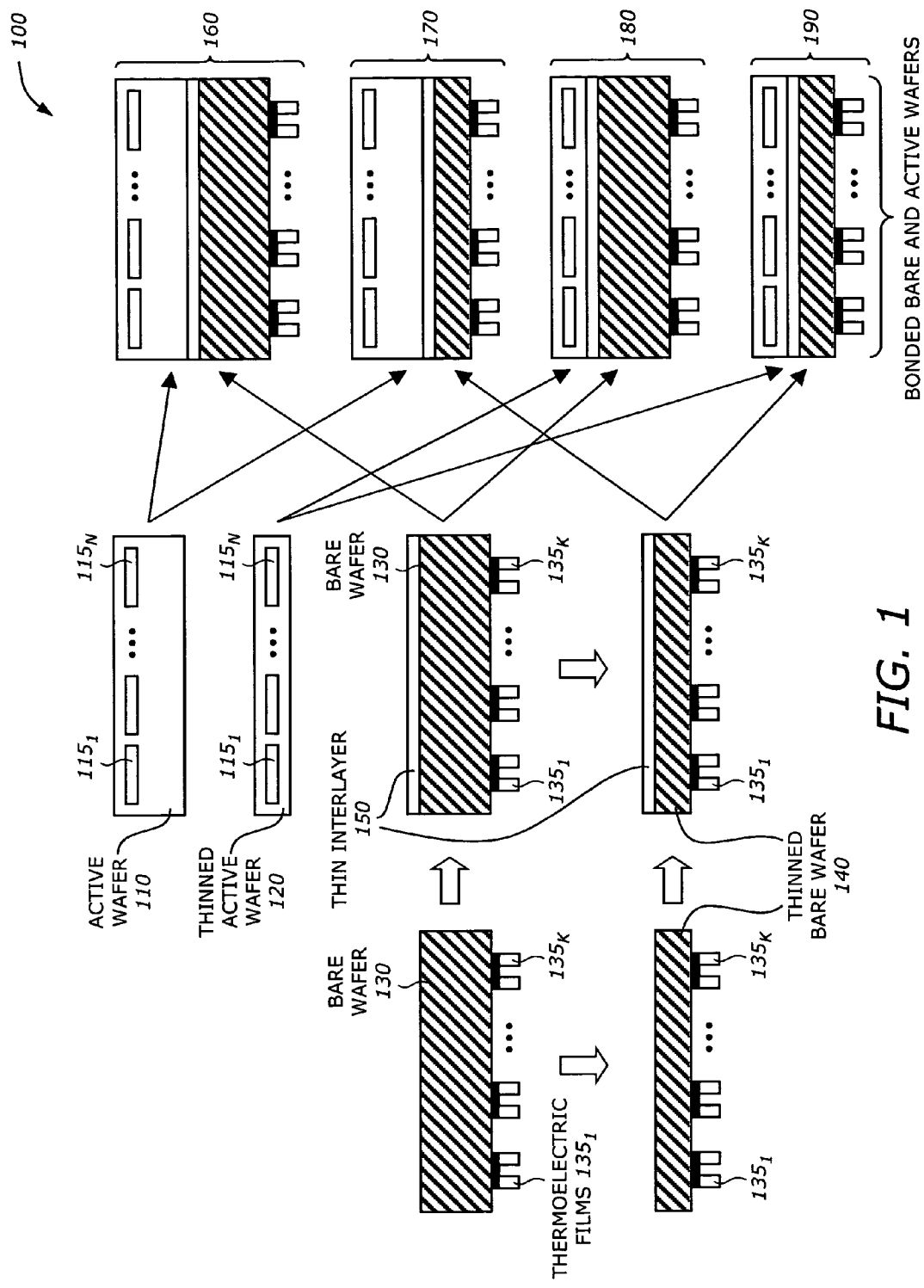
FIG. 1 is a diagram illustrating a process to provide heat extraction to semiconductor devices in which one embodiment of the invention can be practiced.

FIG. 1 is a diagram illustrating a process 100 to provide heat extraction to semiconductor devices in which one embodiment of the invention can be practiced. The process 100 starts with an active wafer 110 and a bare wafer 130. The active wafer 110 and the bare wafer 130 will be bonded together.

The active wafer 110 is a wafer that contains the dies $115_1$ to $115_N$ of devices or processors that heat extraction needs to be provided. The active wafer 110 may be thinned to a suitable thickness to a thinned active wafer 120. The bare wafer 130 is a silicon wafer that has thermoelectric films or elements $135_1$ to $135_K$ to provide cooling or refrigeration to the devices or processors of the dies when they are powered. The thermoelectric films or elements $135_1$ to $135_K$ are fabricated onto the bare wafer 130 at appropriate locations corresponding to the locations that need to have thermal control on the active wafer 110 or 120 such as localized hot spots that generate heat when the devices are powered and running. The thermoelectric films or elements $135_1$ to $135_K$ are made of a suitable thermoelectric material such as an alloy comprising at least one of bismuth (Bi), tellurium (Te), antimony (Sb), lead (Pb), silicon (Si), germanium (Ge). As is known by one skilled in the art, any suitable thermoelectric material may be used. In one embodiment, the alloy may be one of Bi and Te, Sb and Te, Zn and Sb, Te, Ag, Ge, and Sb, and Pb and Te. Examples are $Bi_2Te_3$, $Sb_2Te_3$. Power control signals may be provided so that they may be selectively and/or individually turned on or off.

The bare wafer 130 may be thinned to a thinned bare wafer 140 to a desired thickness before bonding. The desired thickness may be a few hundred microns. There is typically an optimal thickness beyond which the heat extraction result may become worse. The thin bare wafer 140 provides better thermal interface because the heat transfer between the two wafers is more efficient. The bare wafer 130 is then coated by a thin interlayer 150 such as a surfactant to enhance bonding. Similarly, the thinned bare wafer 140 is coated with a thin interlayer 150.

The active wafer 110 or the thinned active wafer 120 is then bonded to either the coated bare wafer 130 or the coated thinned bare wafer 140. The results are the bonded wafers 160, 170, 180, and 190. During bonding, the two wafers are aligned so that their areas match such that the thermoelectric films are at locations corresponding to the locations on the active wafer 110 or the thinned active wafer 120 that need heat extraction. Typically, these locations are known in advance in the design and fabrication of the active wafer 110 or 120. These locations are then mapped to the bare wafer 130 or 140 for registration or matching. The thermoelectric films are then located at these matching locations. Then the backside of the bare wafer 130 or the thinned bare wafer 140 is bonded to the active wafer 110 or the thinned active wafer 120.

The two wafers are then annealed at moderate temperatures such as from 250° C. to 500° C. to form a good covalent bond between the two wafers. The annealing is done by heating the bonded wafers to the desired temperature for a time period (e.g., a few hours) and then allowing the bonded wafers to cool down. The result is a good thermal interface between the two wafers and a mechanically strong bond.

During the fabrication process, the bonded wafers are singulated to provide die assemblies. Each die assembly includes a die having an active device, a substrate from the bare wafer bonded to the die, and at least a thermoelectric film fabricated on the substrate to remove heat from the die when the active device is powered.

The invention offers the following benefits. First, there is an efficient heat removal from the active wafer 110 or 120 due to the reduced thermal interface resistance of the direct bonding. Second, the thermoelectric elements offer the ability to cool localized regions of the active die as well as larger regions depending on the need. Third, the external power delivery to the thermoelectric elements is easy because these elements are in the backside of the bonded wafers. Fourth, scalability can be achieved by thinning the wafers to appropriate thickness prior to bonding. Fifth, the thermoelectric elements may be turned on and off at selected regions by suitable power connections thereby conserving power. Lastly, the manufacturing process may be efficient because the two wafers can be processed separately prior to bonding.

Figure 2:
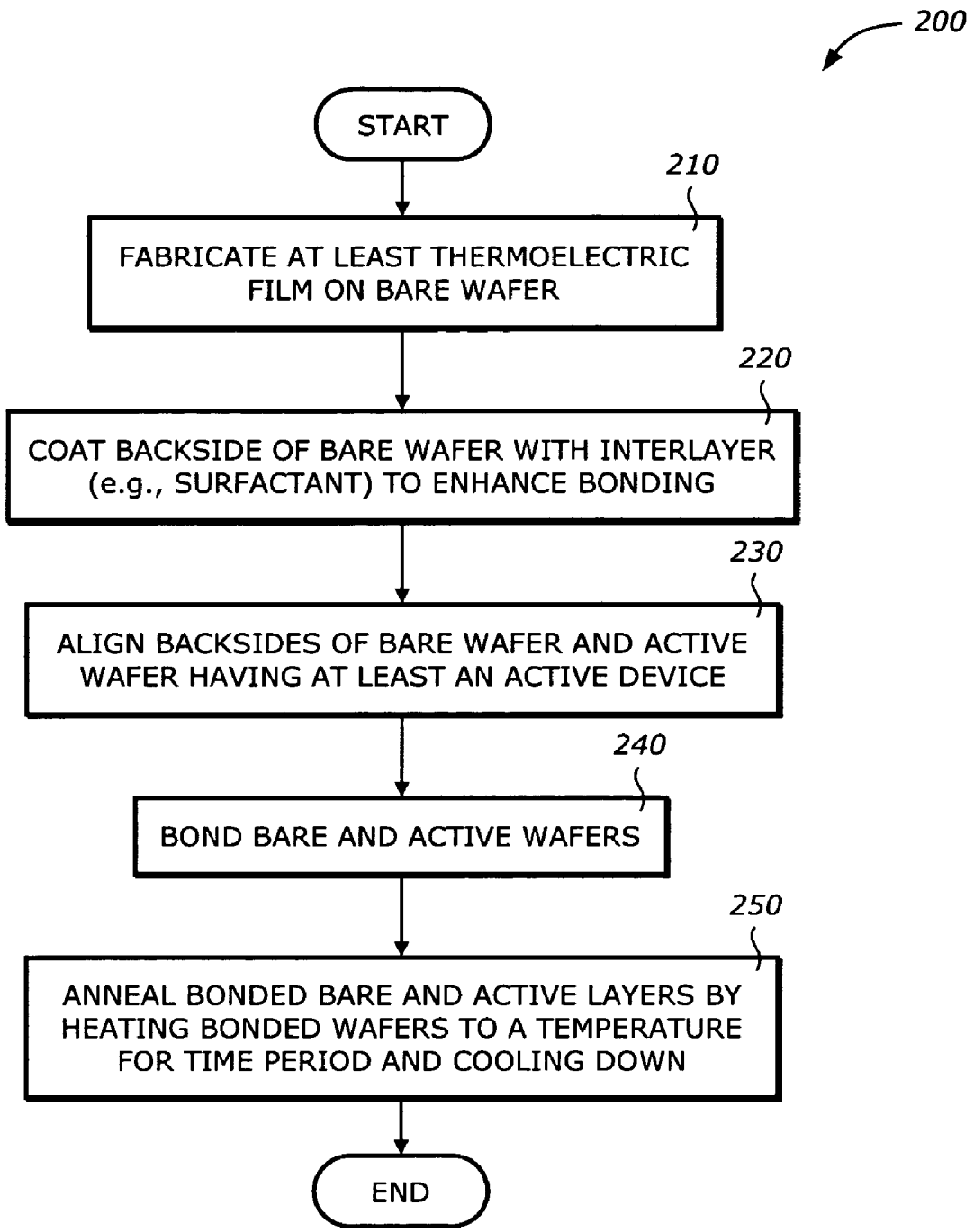
FIG. 2 is a flowchart illustrating a process to provide heat extraction to semiconductor devices according to one embodiment of the invention.

FIG. 2 is a flowchart illustrating a process 200 to provide heat extraction to semiconductor devices according to one embodiment of the invention.

Upon START, the process 200 fabricates at least a thermoelectric film onto a bare wafer (Block 210). Next, the process 200 coats the backside of the bare wafer with a thin interlayer to enhance the bonding (Block 220). Then, the process 200 aligns the backsides of the bare wafer with an active wafer that contains at least a device or processor (Block 230). Next, the process 200 bonds the two wafers together (Block 240).

Then, the process 200 anneals the bonded wafers by heating them to a desired temperature (e.g., from 250° C. to 500° C.) and then allowing them to cool down (Block 250). The process 200 is then terminated.

Figure 3:
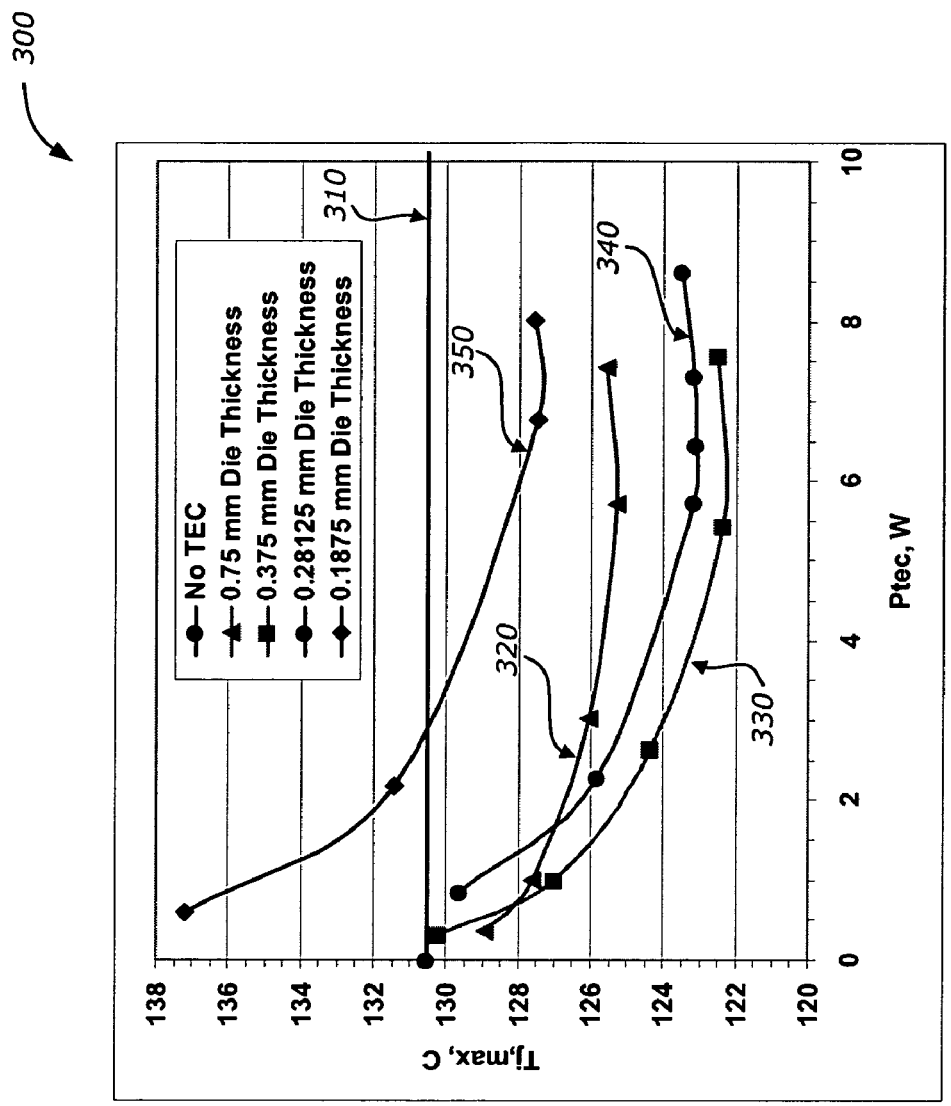
FIG. 3 is a diagram illustrating the effect of die thickness on thermal performance according to one embodiment of the invention.

FIG. 3 is a diagram illustrating the effect of die thickness on thermal performance according to one embodiment of the invention. The diagram shows curves 310, 320, 330, 340, and 350. The horizontal axis is the power input to the thermoelectric in Watts (W). The vertical axis is the junction temperature in degrees Celsius (° C.).

The curves show the thermal performance as a function of power consumption and the die thickness. The die thickness is directly related to the distance between the hot spot and the thermoelectric films. For this experiment and simulation, a thermal test die is used. It has a 400 μm×400 μm hot spot located in the center. The hot spot is powered to 3 W, resulting in a local hot spot flux of 1875 W/cm2. The rest of the die is powered uniformly at 100 W. The curve 310 corresponds to a constant temperature without using the thermoelectric elements. The curves 320, 330, 340, and 350 correspond to using thermoelectric elements at various die thicknesses of 0.75 mm, 0.375 mm, 0.28125 mm, and 0.1875 mm, respectively.

It is shown that there is a significant improvement in thermal performance when the thickness is reduced from 0.75 mm to 0.375 mm. Reducing the die thickness further, however, does not improve the performance. In fact, the curve 350 shows that the thermal performance becomes even worse. Therefore, there is an optimal die thickness that provides the lowest junction temperature. It is expected that the actual results depend on the thermoelectric geometry, material, and power map on the active side of the die.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A wafer assembly comprising:
   a bare wafer having a backside and an opposite side;
   an active wafer bonded to the bare wafer by the backside, the active wafer having at least an active device; and
   at least a thermoelectric film fabricated on the opposite side of the bare wafer located at a location matched to an area localized on the active wafer that needs thermal control.

2. The wafer assembly of claim 1 wherein the at least thermoelectric film is made by an alloy comprising at least one of bismuth (Bi), tellurium (Te), antimony (Sb), lead (Pb), silicon (Si), germanium (Ge).

3. The wafer assembly of claim 2 wherein the alloy comprises one of Bi and Te, Sb and Te, Te, Si, Ge, and Sb, and Pb and Te.

4. The wafer assembly of claim 2 wherein the alloy is one of $Bi_2Te_3$, $Sb_2Te_3$, and $Zn_4Sb_3$.

5. The wafer assembly of claim 1 wherein the at least thermoelectric film is fabricated at the location corresponding to a localized hot spot on the active wafer.

6. The wafer assembly of claim 1 wherein the active wafer is bonded to the bare wafer in alignment.

7. The wafer assembly of claim 1 wherein at least one of the bare wafer and the active wafer is a thinned wafer.

8. The wafer assembly of claim 1 further comprising an interlayer coated at the backside of the bare wafer to enhance bonding.

9. The wafer assembly of claim 1 wherein the bonded bare and active wafers is annealed by being heated at a temperature for a time period and cooled from the temperature.

10. The wafer assembly of claim 1 wherein the bare wafer has power signal to control the at least thermoelectric film.

11. The wafer assembly of claim 1 wherein the at least thermoelectric film is selectively turned on or off by a power controller.

12. A die assembly comprising:
    a die having an active device;
    a substrate having a first side bonded to the die; and
    at least a thermoelectric film fabricated on a second side of the substrate to remove heat from the die when the active device is powered, the at least thermoelectric film being located at a location matched to a localized area that needs thermal control.

13. The die assembly of claim 12 wherein the at least thermoelectric film is made by an alloy comprising at least one of bismuth (Bi), tellurium (Te), cesium (Cs), zinc (Zn), antimony (Sb), lead (Pb), silver (Ag), germanium (Ge).

14. The die assembly of claim 13 wherein the alloy comprises one of Bi and Te, Sb and Te, Zn and Sb, Te, Ag, Ge, and Sb, and Pb and Te.

15. The die assembly of claim 13 wherein the alloy is one of $Bi_2Te_3$, $Sb_2Te_3$, and $Zn_4Sb_3$.

16. The die assembly of claim 12 wherein the at least thermoelectric film is fabricated at the location corresponding to a localized hot spot on the active device.

17. The die assembly of claim 12 further comprising an interlayer coated at the substrate to enhance bonding.

18. The die assembly of claim 12 wherein the at least thermoelectric film is selectively turned on or off by a power controller.

* * * * *